United States Patent
Seo et al.

(10) Patent No.: US 7,745,290 B2
(45) Date of Patent: Jun. 29, 2010

(54) METHODS OF FABRICATING SEMICONDUCTOR DEVICE INCLUDING FIN-FET

(75) Inventors: Jun Seo, Gyeonggi-do (KR); Jong-Heui Song, Gyeonggi-do (KR); Jae-Seung Hwang, Gyeonggi-do (KR); Min-Chul Chae, Gyeonggi-do (KR); Woo-Jin Cho, Gyeonggi-do (KR); Yun-Seung Kang, Seoul (KR); Young-Mi Lee, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 387 days.

(21) Appl. No.: 11/773,372

(22) Filed: Jul. 3, 2007

(65) Prior Publication Data

US 2008/0124871 A1 May 29, 2008

(30) Foreign Application Priority Data

Jul. 3, 2006 (KR) .................... 10-2006-0062111

(51) Int. Cl.
H01L 21/336 (2006.01)
(52) U.S. Cl. .................. 438/270; 438/164; 438/212; 438/589; 257/E21.41
(58) Field of Classification Search ................. 438/164, 438/270, 589; 257/E21.41
See application file for complete search history.

(56) References Cited

U.S. PATENT DOCUMENTS

| | | | |
|---|---|---|---|
| 6,562,665 B1 | 5/2003 | Yu | |
| 6,571,384 B2 * | 5/2003 | Shin et al. | 716/21 |
| 2005/0032322 A1 * | 2/2005 | Kim et al. | 438/301 |
| 2005/0173759 A1 * | 8/2005 | Kim et al. | 257/331 |
| 2005/0179030 A1 * | 8/2005 | Seo et al. | 257/20 |
| 2005/0285204 A1 * | 12/2005 | Kim et al. | 257/368 |
| 2006/0244055 A1 * | 11/2006 | Jang et al. | 257/330 |
| 2007/0278595 A1 * | 12/2007 | Wu | 257/384 |

(Continued)

FOREIGN PATENT DOCUMENTS

KR 10-2005-0015975 2/2005

(Continued)

OTHER PUBLICATIONS

English language abstract of Korean Publication No. 10-2005-0015975, Feb. 21, 2005.

(Continued)

*Primary Examiner*—Charles D Garber
*Assistant Examiner*—Angel Roman
(74) *Attorney, Agent, or Firm*—Myers Bigel Sibley & Sajovec, PA

(57) ABSTRACT

A method of fabricating a semiconductor device including a fin field effect transistor (Fin-FET) includes forming sacrificial bars on a semiconductor substrate, patterning the sacrificial bars to form sacrificial islands on the semiconductor substrate, forming a device isolation layer to fill a space between the sacrificial islands, selectively removing the sacrificial islands to expose the semiconductor substrate below the sacrificial islands, and anisotropically etching the exposed semiconductor substrate using the device isolation layer as an etch mask to form a recessed channel region. The recessed channel region allows the channel width and channel length of a transistor to be increased, thereby reducing the occurrence of short channel effects and narrow channel effects in highly integrated semiconductor devices.

12 Claims, 16 Drawing Sheets

U.S. PATENT DOCUMENTS

2009/0026530 A1* 1/2009 Wilson et al. ............... 257/328
2009/0111239 A1* 4/2009 Kim ........................... 438/426
2009/0146243 A1* 6/2009 Lee ........................... 257/506

FOREIGN PATENT DOCUMENTS

| KR | 10-2005-0092508 | 9/2005 |
|---|---|---|
| KR | 10-2006-0000275 | 1/2006 |
| KR | 10-2006-0065212 | 6/2006 |

OTHER PUBLICATIONS

English language abstract of Korean Publication No. 10-2006-0000275, Jan. 6, 2006.

* cited by examiner

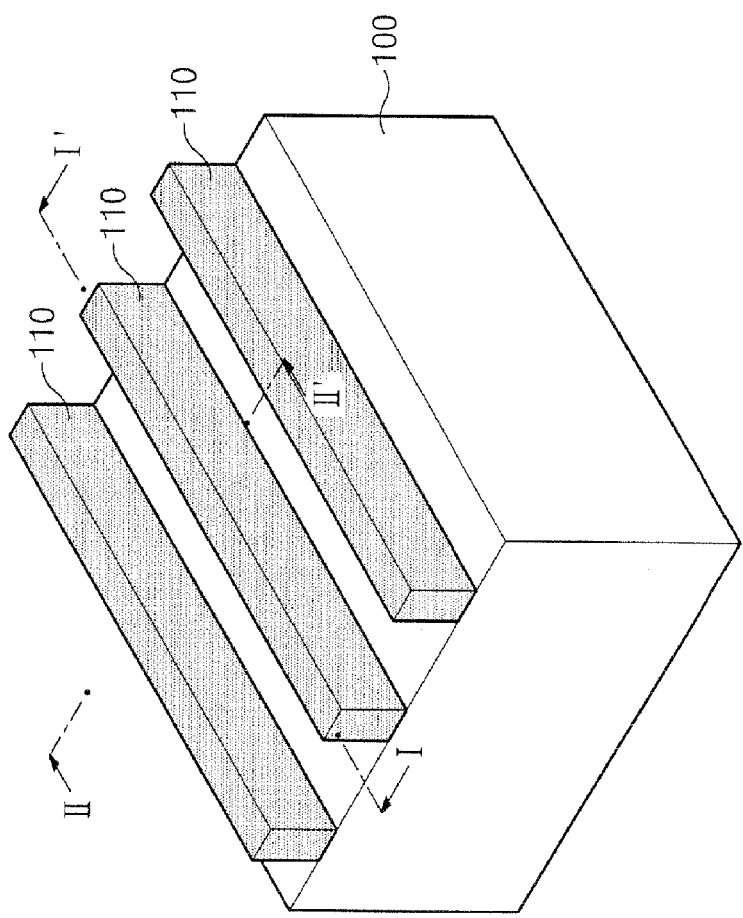

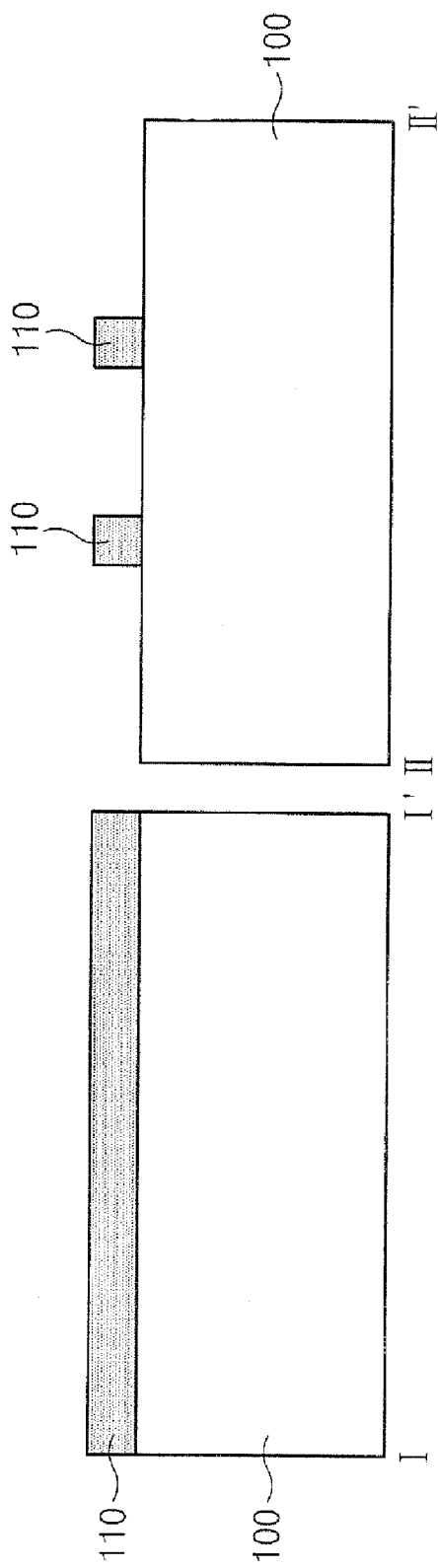

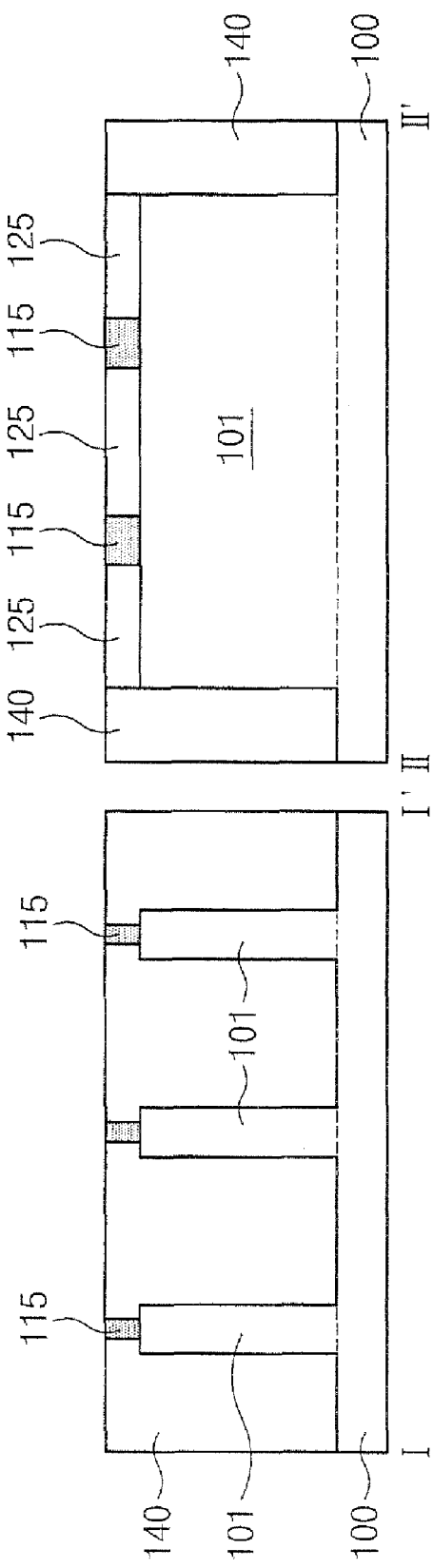

METHODS OF FABRICATING SEMICONDUCTOR DEVICE INCLUDING FIN-FET

CROSS-REFERENCE TO RELATED APPLICATIONS

This U.S. non-provisional patent application claims priority under 35 U.S.C §119 to Korean Patent Application No. 2006-62111, filed on Jul. 3, 2006, the entirety of which is hereby incorporated by reference.

BACKGROUND

1. Technical Field

The present invention relates to methods of fabricating semiconductor devices and, more specifically, to methods of fabricating a semiconductor device including a fin field effect transistor (Fin-FET).

2. Description of the Related Art

A conventional field effect transistor (FET) includes an active region, a gate electrode crossing over the active region, and source/drain electrodes formed in active regions adjacent to opposite sides of the gate electrode. An active region below the gate electrode is used as a channel region (through which charges migrate). That is, the channel region refers to an active region between the source electrode and the drain electrode.

With the recent trend toward higher integration density of semiconductor devices, the width of gate electrodes and the width of active regions are decreasing. However, in the case of the FET structure, if the width of a gate electrode decreases, the length of a channel region (i.e., a space between a source region and a drain region) also decreases. As a result, a short channel effect (SCE) such as drain induced barrier lowering (DIBL) or punch-through may occur. Further, if the width of an active region decreases, the width of a channel also decreases causing a narrow width effect such as drain current lowering.

Essentially, the short channel effect results from incomplete control of the gate electrode for an electronic state of the channel region. In view of the foregoing, fin field effect transistors (Fin-FETs), each having a vertical channel region, have been proposed in recent years. In such a Fin-FET, a gate electrode controls a channel region from three sides to be more effective in suppressing the short channel effect. Moreover, the width of the channel increases due to a vertical channel region (i.e., a sidewall of a fin) so as to be more effective in suppressing the narrow channel effect than conventional planar FETs. Nevertheless, since most memory transistors detect information stored in a memory cell by means of a method for sensing drain current, FET structures with increased drain current have been required to enhance a sensing characteristic of a memory cell.

SUMMARY

Exemplary embodiments of the present invention provide a method of fabricating a semiconductor device. In an exemplary embodiment, the method may include: forming sacrificial bars on a semiconductor substrate; patterning the sacrificial bars to form sacrificial islands on the semiconductor substrate; forming a device isolation layer to fill a space between the sacrificial islands; selectively removing the sacrificial islands to expose the semiconductor substrate below the sacrificial islands; and anisotropically etching the exposed semiconductor substrate using the device isolation layer as an etch mask to form a recessed channel region. The semiconductor device fabricated in accordance with embodiments of the present invention has a recessed channel region which allows the channel width and/or length of a transistor to increase, thereby suppressing short channel and/or narrow channel effects arising from the high integration density of semiconductor devices.

BRIEF DESCRIPTION OF THE DRAWINGS

FIGS. 1A-8A are perspective views illustrating a method of fabricating a semiconductor device according to embodiments of the present invention.

FIGS. 1B-8B are cross-sectional views illustrating a method of fabricating a semiconductor device according to embodiments of the present invention.

DETAILED DESCRIPTION

Figure 2A:
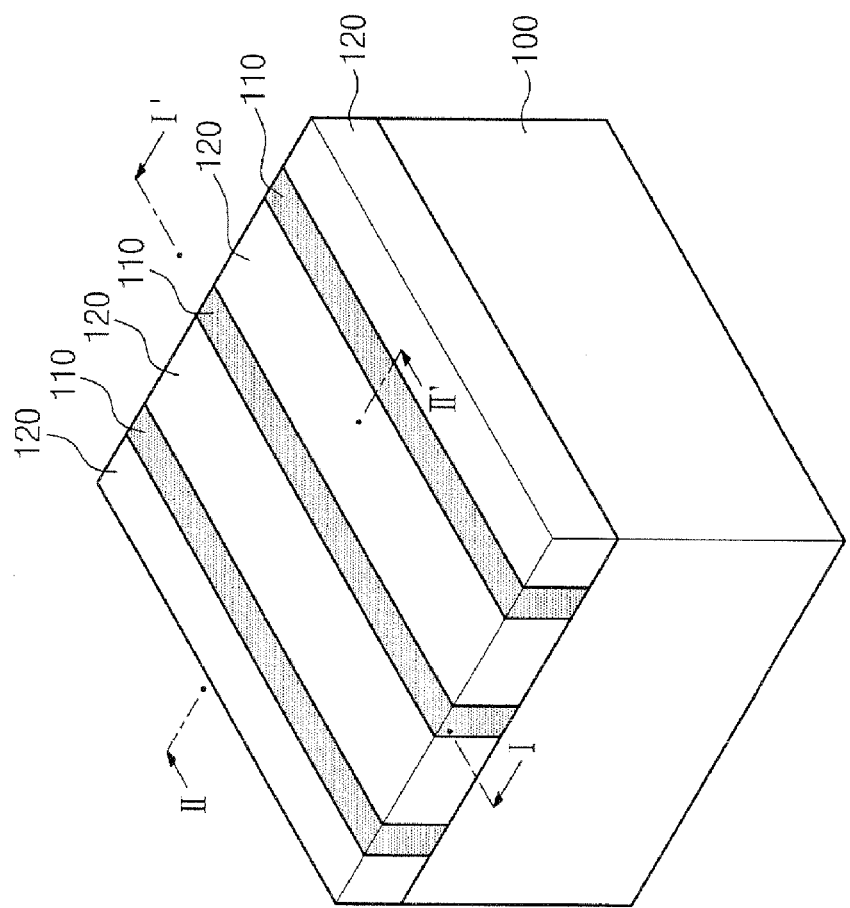

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numbers refer to like elements throughout.

FIGS. 1A-8A and FIGS. 1B-8B are perspective views and cross-sectional views, respectively, illustrating a method of fabricating a semiconductor device according to the present invention. Left and right parts illustrated in FIGS. 1B-8B are sections taken along lines I-I' and II-II' of FIGS. 1A-8A, respectively.

Referring to FIGS. 1A and 1B, a sacrificial layer is formed on a semiconductor substrate 100. The sacrificial layer is patterned to form sacrificial bars 110 having major axes parallel to each other. The semiconductor substrate 100 may be made of single crystalline silicon, and each of the sacrificial bars 110 is made of a material having an etch selectivity with respect to the semiconductor substrate 100.

In an embodiment of the invention, the sacrificial bars 110 may be made of silicon nitride or silicon oxynitride. Moreover, a silicon oxide layer (not shown) may be formed between the sacrificial bars 110 and the semiconductor substrate 100 to release a stress caused by the difference in thermal expansion coefficient.

Figure 2B:
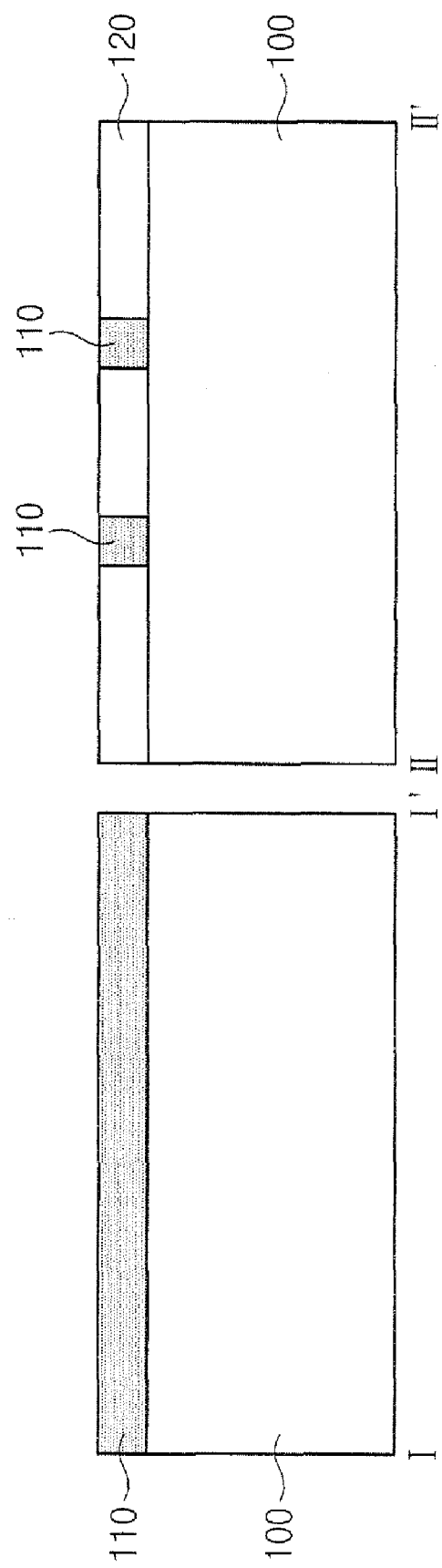

Referring to FIGS. 2A and 2B, a mask layer 120 is formed on the resultant structure where the sacrificial bars 110 are formed. The mask layer 120 is used as an etch mask during an etch process for forming a trench, which will be described below with reference to FIGS. 3A and 3B. Accordingly, the mask layer 120 is made of one selected from the group consisting of materials having an etch selectivity with respect to the sacrificial bars 110 and the semiconductor substrate 100. For example, if the semiconductor substrate 100 is made of silicon and the sacrificial bars 110 are made of silicon nitride, the mask layer 120 may be made of silicon oxide.

The mask layer 120 is planarized to expose top surfaces of the sacrificial bars 110. As a result, the mask layer 120 covers a top surface of the semiconductor substrate 100 between the sacrificial bars 110. The planarization of the mask layer 120 may be done by means of chemical mechanical polishing (CMP).

Figure 3A:
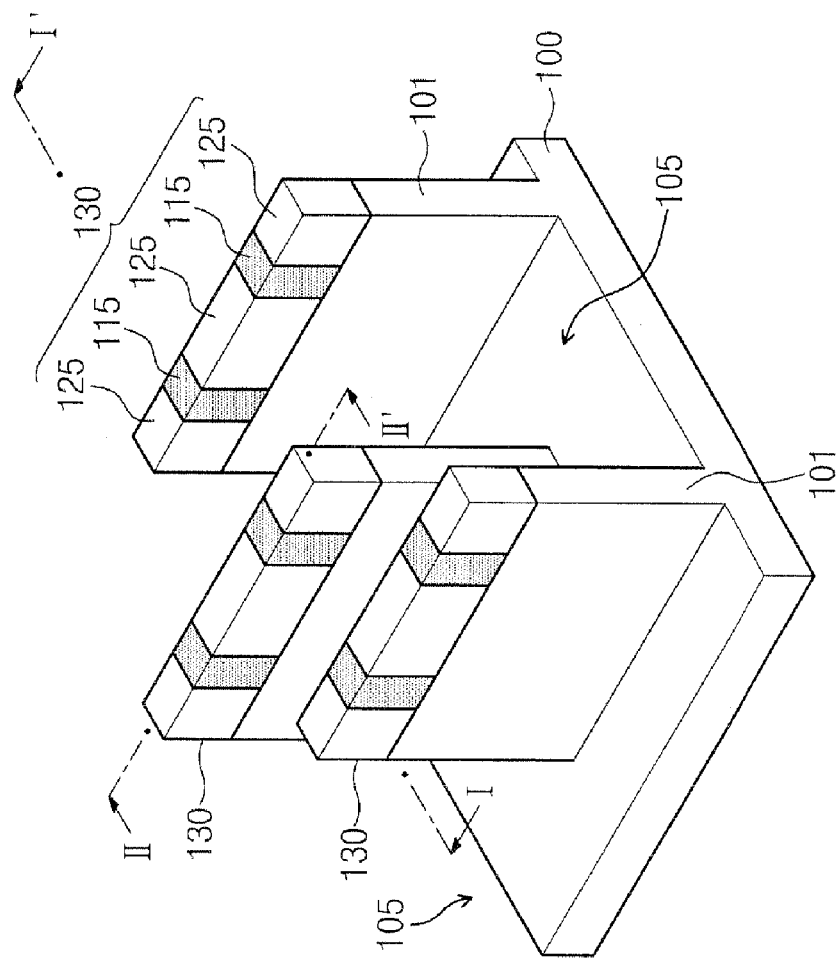
Figure 3B:
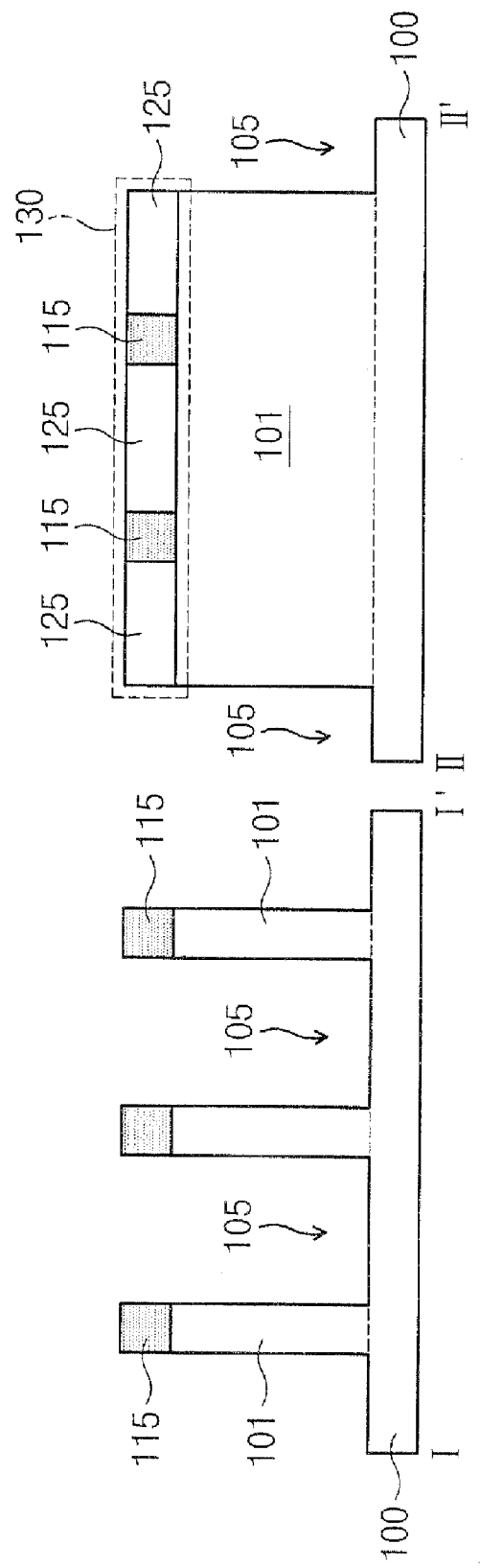

Referring to FIGS. 3A and 3B, the mask layer 120 and the sacrificial bars 110 are patterned in a direction crossing the sacrificial bars 110 to form trench mask patterns 130 exposing the semiconductor substrate 100. That is, the trench mask patterns 130 are disposed to be perpendicular to the major axis of the sacrificial bars 110.

According to the present invention, each of the trench mask patterns 130 is obtained by etching the mask layer 120 and the sacrificial bars 110 and includes mask patterns 125 and sacrificial islands 115. Since the trench mask pattern 130 is disposed in a direction crossing the sacrificial bars 110, the sacrificial islands 115 are disposed between the mask patterns 125 and exhibit a substantially cubic or rectangular solid shape, as illustrated in FIG. 3A.

More specifically, the sacrificial islands 115 are formed by performing a patterning process twice in a perpendicular direction to each other, as described above. Therefore, the sacrificial islands 115 exhibit a nearly rectangular shape when viewed from the top. For example, a curvature radius of four corners defined by the sidewalls of the sacrificial bars 115 is smaller than $1/5$ of the width of the trench mask patterns 130.

As described above, the sacrificial islands 115 are disposed between the mask patterns 125. Thus, two of the four sidewalls of the sacrificial island 115 are hidden by the mask patterns 125 and the other sidewalls and a top surface thereof are exposed.

The semiconductor substrate 100 is anisotropically etched using the trench mask patterns 130 as etch masks, forming trenches 105 to define active patterns 101. The active patterns 101 correspond to an unetched semiconductor substrate 100 below the trench mask 130, and the trenches 105 are spaces formed by anisotropically etching the semiconductor substrate 100.

It will be understood that in the case of a DRAM, (1) a plurality of separate active patterns are formed in a cell array region; (2) a pair of transistors are formed at the respective active patterns; (3) and the pair of transistors share one drain electrode. Hence, to apply the present invention to a DRAM, it is necessary to form a trench mask pattern 130 including three mask patterns 125 and two sacrificial islands 115 disposed therebetween, as illustrated in FIG. 3A.

Figure 4A:
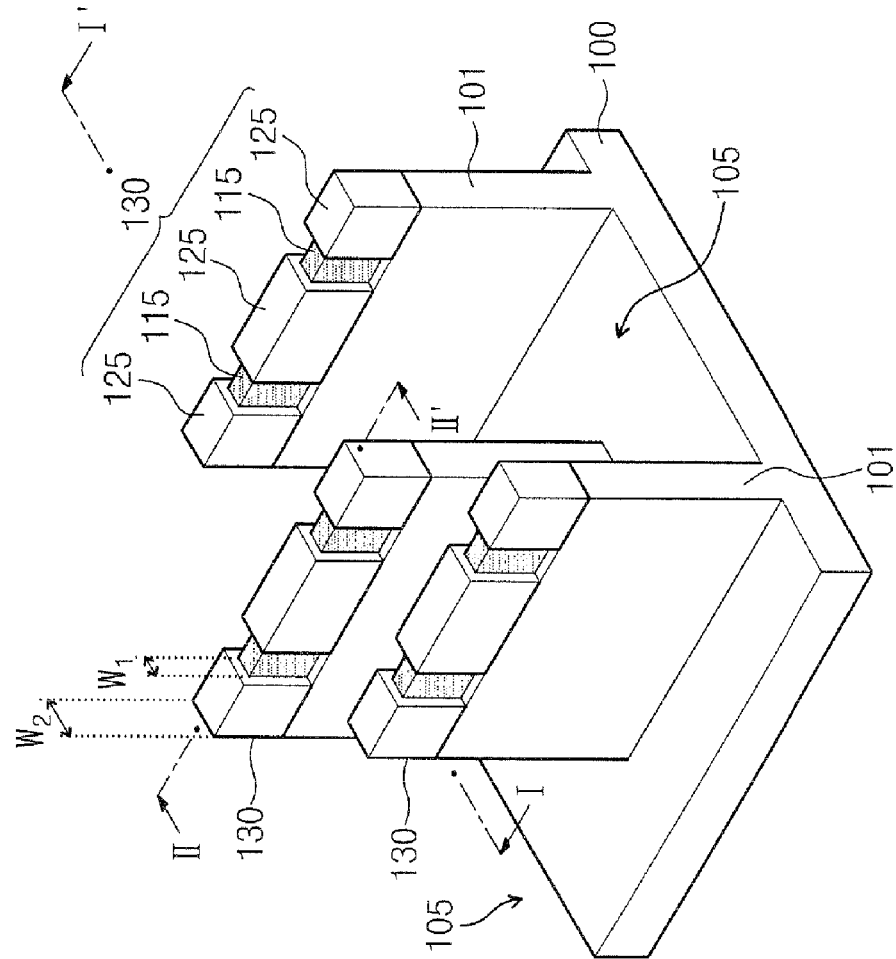
Figure 4B:
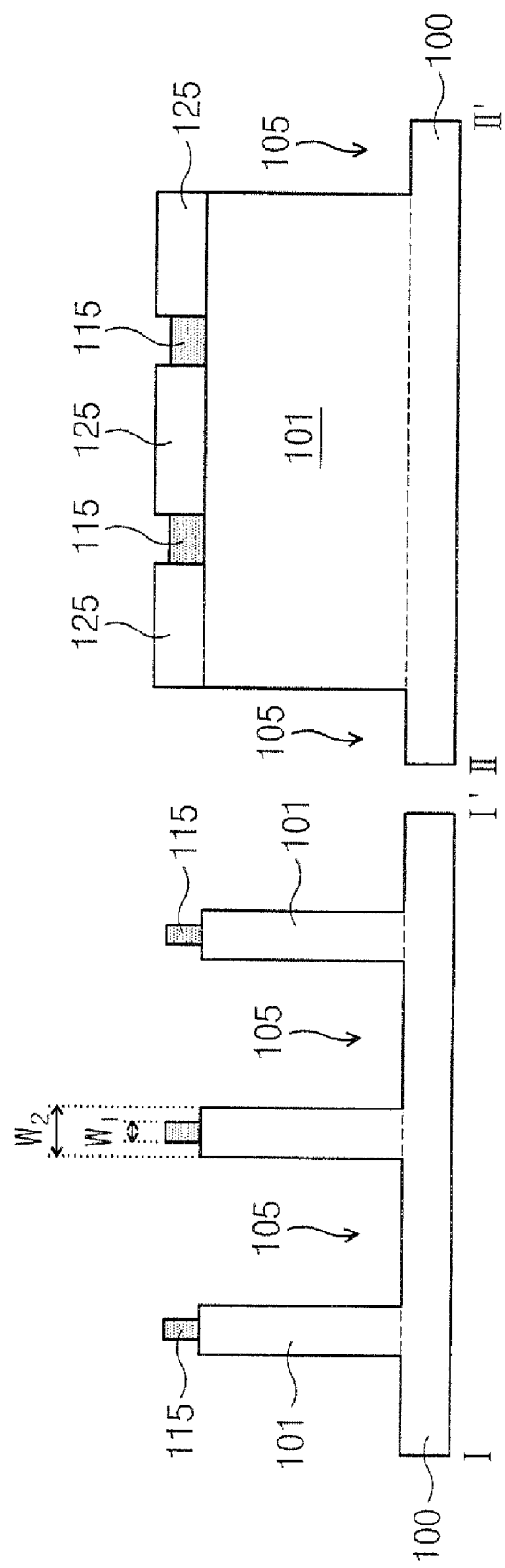

As illustrated in FIGS. 4A and 4B, the sacrificial islands 115 are isotropically etched using an etch recipe having an etch selectivity with respect to the mask pattern 130 and the semiconductor substrate 100. As a result, the width w1 of the sacrificial islands 115 is smaller than the width w2 of the mask pattern 130 and the active pattern 101 (a process of etching an exposed surface to contract the volume of a target object in this way is called a pull-back process).

As described above, in the case where the semiconductor substrate 100, the mask layer 120, and the sacrificial bar 110 are made of silicon, silicon oxide, and silicon nitride, respectively, an etch selectivity required to reduce the width of the sacrificial islands 115 may be obtained using phosphoric acid as an etchant. Since two of the four sidewalls of the sacrificial islands 115 are hidden by the mask pattern 125, only an exposed top surface and two exposed sidewalls thereof are etched during a pull-back process for the sacrificial islands 115. As a result, sidewall corners of the sacrificial islands 115 subjected to the pull-back process still have a sufficiently small curvature radius.

Figure 5A:
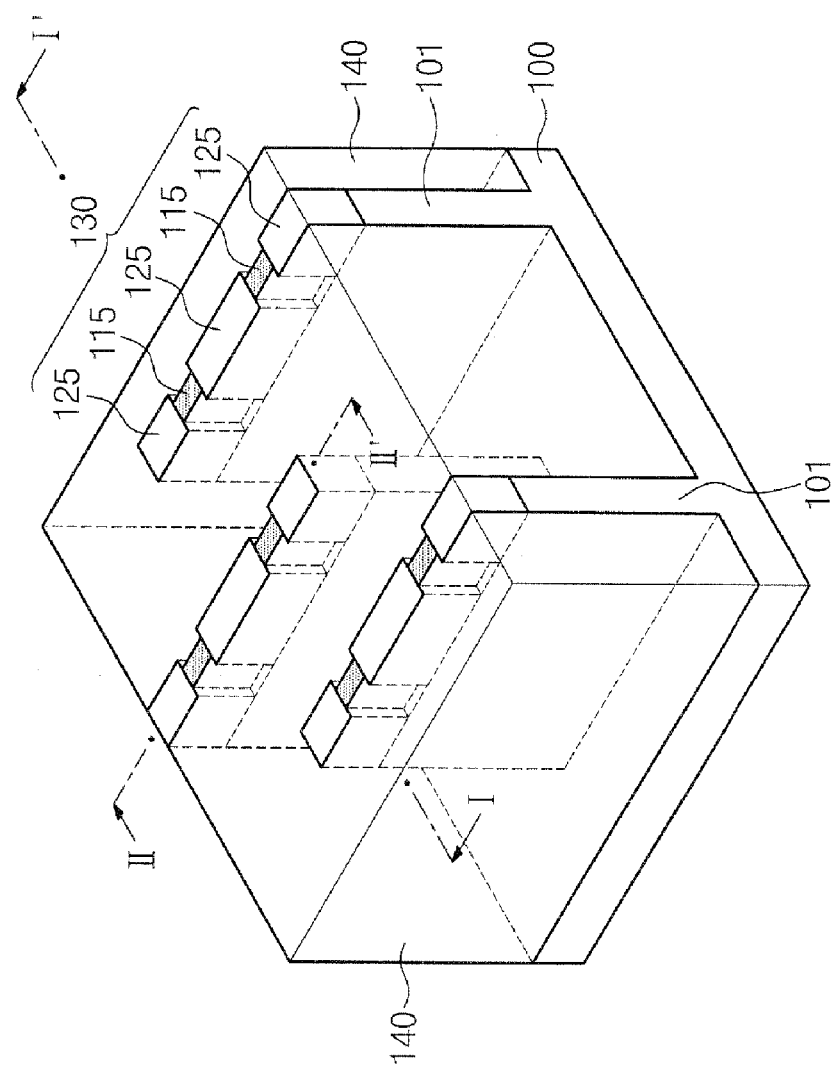

Referring to FIGS. 5A and 5B, a device isolation layer 140 is formed on the resultant structure, where the pull-back process is performed, to fill the trench 105. The device isolation layer 140 may be made of one selected from the group consisting of materials having an etch selectivity with respect to the sacrificial islands 115. In an embodiment of the invention, the device isolation layer 140 is made of silicon oxide and may further include silicon nitride.

The device isolation layer 140 is planarized to expose top surfaces of the sacrificial islands 115 and the mask patterns 125. According to the foregoing embodiment, since both the device isolation layer 140 and the mask patterns 125 are made of silicon oxide, each of the sacrificial islands 115 is isolated by the silicon oxide.

In another embodiment of the invention, prior to the formation of the device isolation layer 140, a thermal oxide layer (not shown) may be further formed on a top surface of the semiconductor substrate 100 exposed through the trench 105. Further, a liner layer may be formed on the resultant structure where the thermal oxide layer is formed.

Figure 6A:
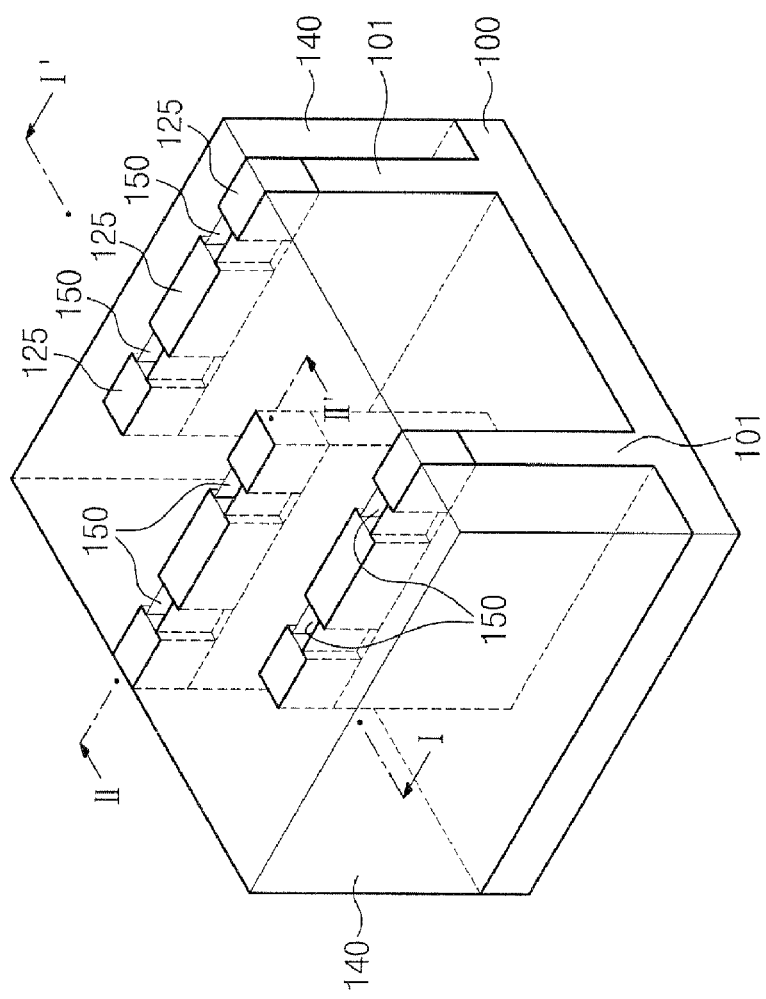
Figure 6B:
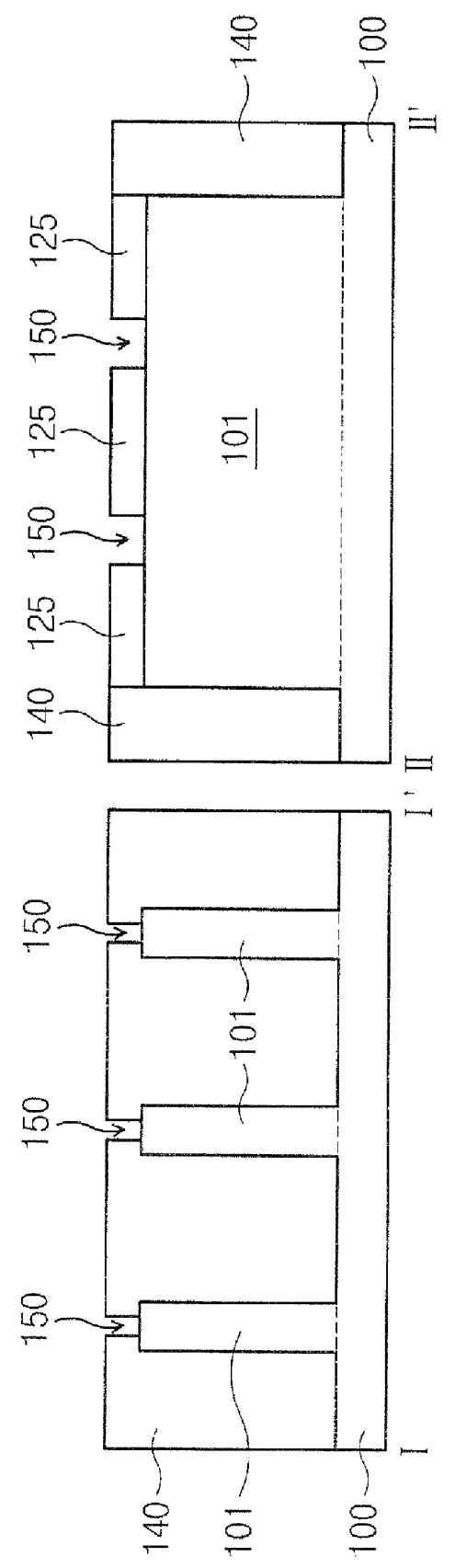

Referring to FIGS. 6A and 6B, the sacrificial islands 115 are selectively removed, forming openings 150 to expose the top surfaces of the active patterns 101. The openings are surrounded by the device isolation layer 140 and the mask patterns 125. That is, the device isolation layer 140 defines two opposite sidewalls of the opening 150 and the mask patterns 125 define the other opposite sidewalls thereof.

As described above, the sacrificial islands 115 exhibit a nearly rectangular shape when viewed from the top. Therefore, the openings 150 formed by removing the sacrificial islands 115 also exhibit a substantially rectangular shape when viewed from the top. In an embodiment of the invention, a curvature radius of the side corner of the opening 150 is smaller than $1/5$ of the width of the active pattern 101.

Figure 7A:
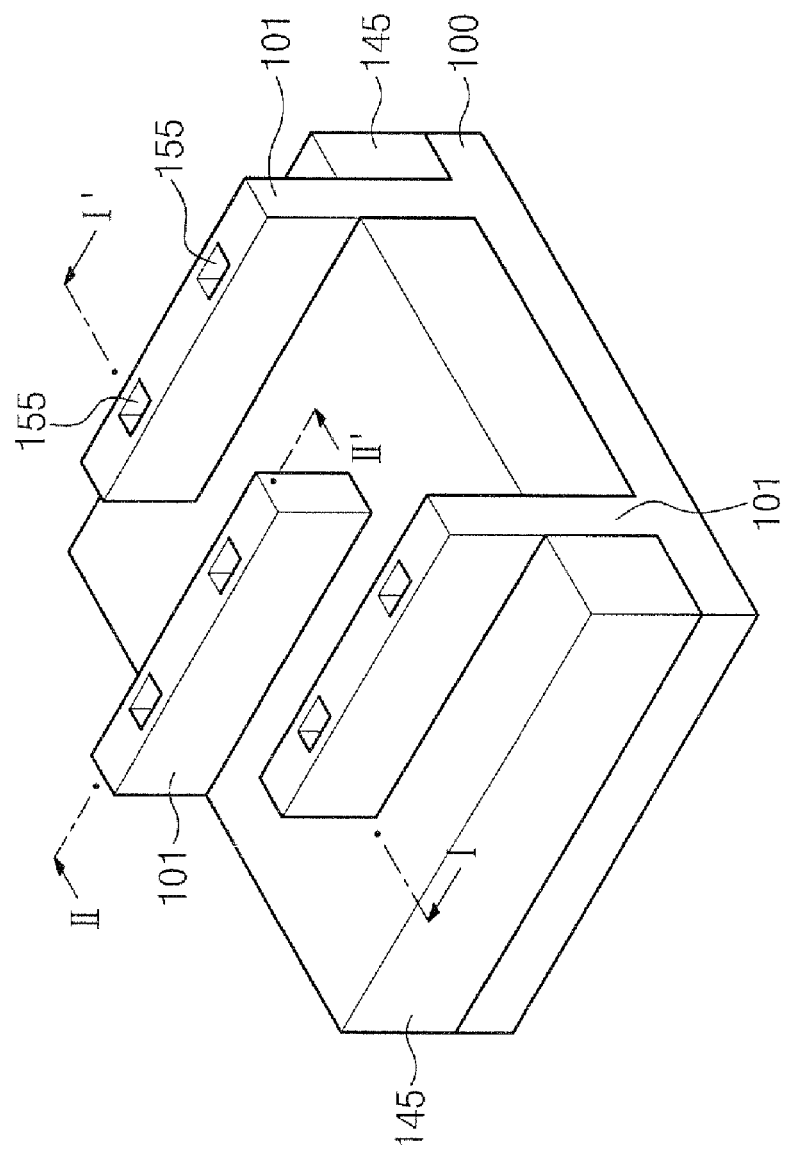
Figure 7B:
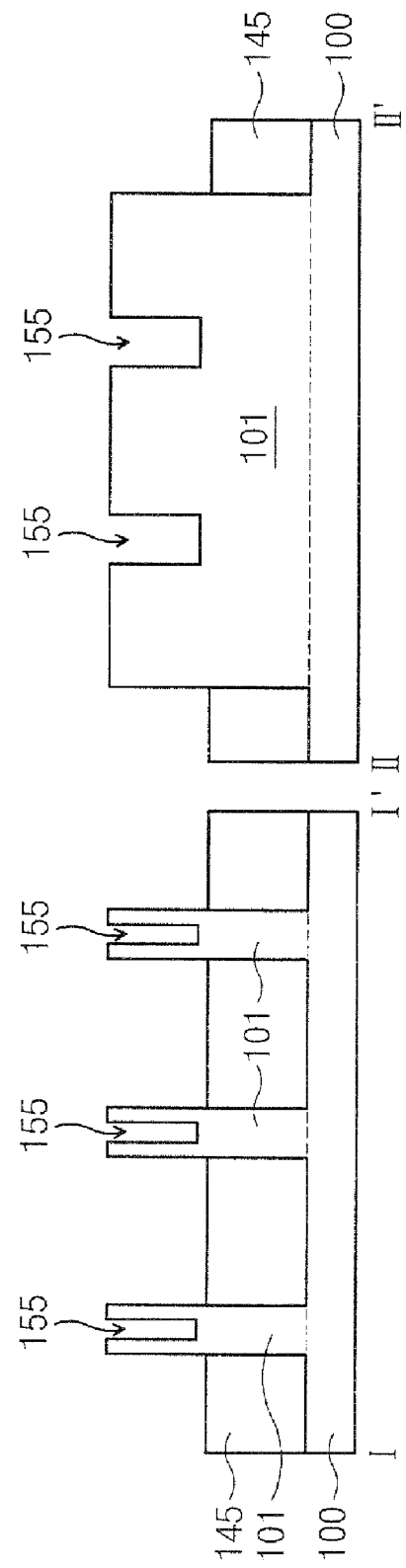

Referring to FIGS. 7A and 7B, the active pattern 101 exposed through the opening 150 is anisotropically etched using the mask patterns 125 and the device isolation layer 140 as etch masks, forming a recessed channel region 155 to contribute to an increase in the channel width of a transistor.

The mask patterns 125 and the device isolation layer 140 are etched using an etch recipe capable of minimizing etching of the active pattern 101 to expose top surfaces and upper sidewalls of the active patterns 101. During this etching, the mask patterns 125 are removed and the device isolation layer 140 is etched to become a device isolation pattern 145. The device isolation pattern 145 is disposed to fill a lower portion of the trench 105.

In another embodiment of the invention, not only the mask patterns 125 but also the device isolation layer 140 may be etched during the formation of the recessed channel region 155. In this case, the top surfaces and upper sidewalls of the active patterns 101 may be exposed without an additional step of etching the mask patterns 125 and the device isolation layer 140.

Figure 8A:
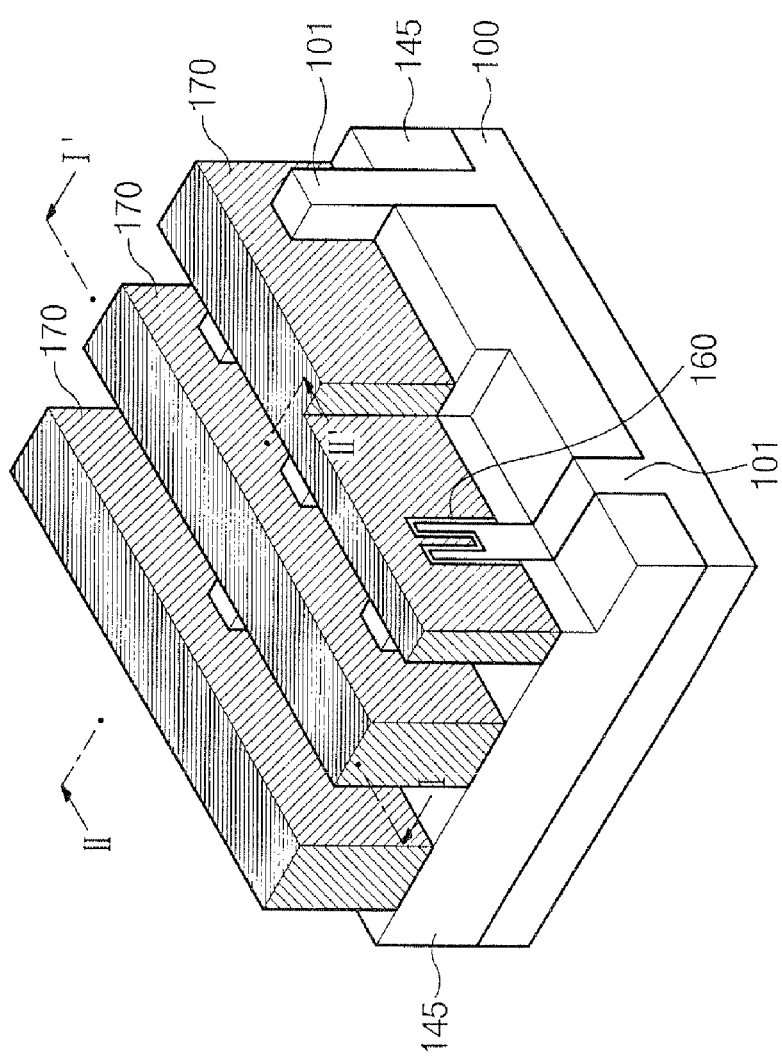
Figure 8B:
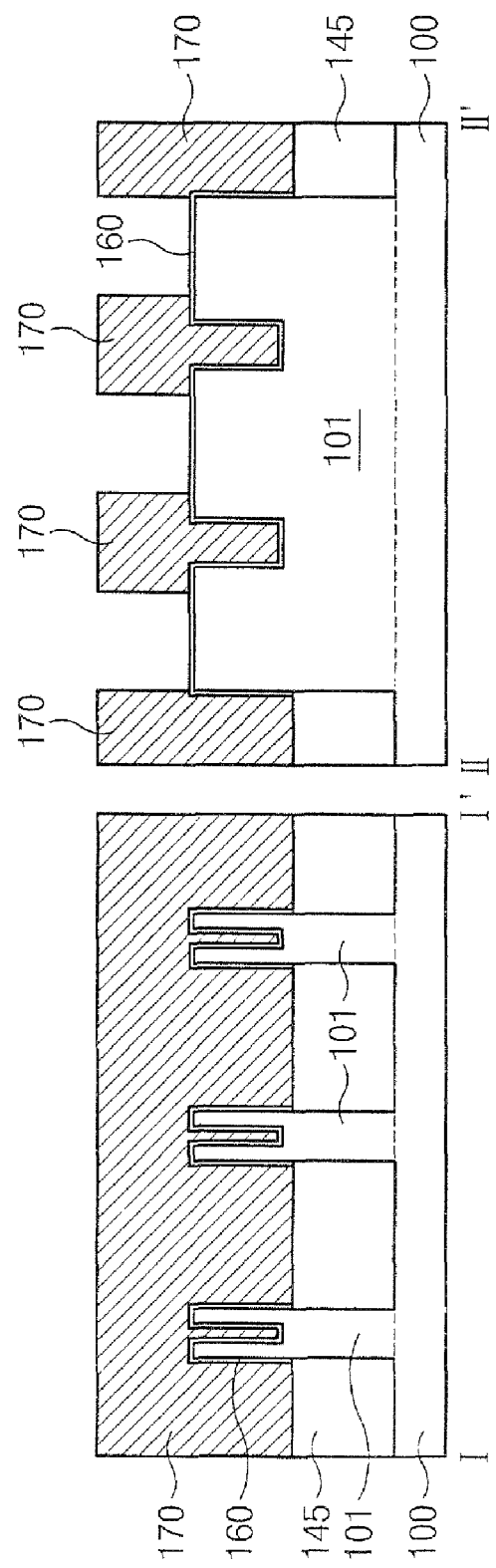

Referring to FIGS. 8A and 8B, a gate insulating layer 160 is formed to cover the exposed surface (i.e., the top surface and the upper sidewall) of the active pattern 101. In an embodiment of the invention, the gate insulating layer 160 is a silicon oxide layer formed by means of a thermal oxidation process. Alternatively, the gate insulating layer 160 may be made of one selected from the group consisting of silicon nitride, silicon oxide, and a high-k dielectric material.

A gate electrode layer is formed on the resultant structure where the gate insulating layer 160 is formed. The gate electrode layer is patterned to form the gate electrodes 170 crossing over the active patterns 101. The gate electrode layer may be made of at least one selected from the group consisting of polysilicon, silicide, and metal. Using the gate electrodes 170 as ion masks, impurity regions (not shown) may be formed at the active pattern 101 to be used as a source/drain electrode of the transistor.

As explained above, a recessed channel region is formed using openings formed by selectively removing sacrificial islands. Due to the recessed channel region, the channel width and/or length of a transistor increases to suppress a short channel effect and/or a narrow channel effect arising from high integration density of semiconductor devices. The formation of the sacrificial islands disposed to define positions of the openings and recessed channel region is done by performing a patterning process twice in different directions. Thus, the sacrificial islands and the recessed channel region may all exhibit a rectangular solid shape having a sufficiently small curvature radius.

In an exemplary embodiment of the present invention, a method of fabricating a semiconductor device may include: forming sacrificial bars on a semiconductor substrate; patterning the sacrificial bars to form sacrificial islands on the semiconductor substrate; forming a device isolation layer to fill a space between the sacrificial islands; selectively removing the sacrificial islands to expose the semiconductor substrate below the sacrificial islands; and anisotropically etching the exposed semiconductor substrate using the device isolation layer as an etch mask to form a recessed channel region.

In another exemplary embodiment, the method may include: forming sacrificial bars on a semiconductor substrate; forming a mask layer to fill a space between the sacrificial bars; patterning the mask layer and the sacrificial bars in a direction perpendicular to a major axis of the sacrificial bar to form mask patterns and sacrificial islands disposed therebetween; etching the semiconductor substrate using the mask patterns and the sacrificial islands as etch masks to form trenches, the trench being formed to define active patterns; etching the sacrificial islands to partially expose the a top surface of the active pattern between the mask patterns; forming a device isolation layer to fill the trenches and surround the mask patterns and the sacrificial islands; selectively removing the sacrificial islands to expose the active pattern; anisotropically etching the mask patterns using the device isolation layer and the mask patterns as etch masks to form a recessed channel region; etching the device isolation layer to expose a top surface and an upper sidewall of the active pattern; and forming a gate electrode to fill the recessed channel region, the gate electrode crossing over the active patterns.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A method of forming a semiconductor device, the method comprising:
   forming sacrificial bars on a semiconductor substrate;
   patterning the sacrificial bars to form sacrificial islands on the semiconductor substrate;
   forming a device isolation layer to fill a space between the sacrificial islands;
   selectively removing the sacrificial islands to expose the semiconductor substrate below the sacrificial islands; and
   anisotropically etching the exposed semiconductor substrate using the device isolation layer as an etch mask to form a recessed channel region;
   wherein before forming the sacrificial islands:
      forming a mask layer to fill a space between the sacrificial bars; and
      planarizing the mask layer to expose top surfaces of the sacrificial bars,
      wherein the mask layer comprises a material having an etch selectivity with respect to the sacrificial bars; and
   wherein forming the sacrificial islands comprises:
      patterning the mask layer and the sacrificial bars in a direction substantially perpendicular to a major axis of the sacrificial bars to form the sacrificial islands and mask patterns disposed therebetween; and
      etching the exposed surfaces of the sacrificial islands using the mask patterns as etch masks to partially expose the top surface of the semiconductor substrate between the mask patterns.

2. The method as recited in claim 1, wherein forming the sacrificial islands comprises:
   patterning the sacrificial bars in a direction substantially perpendicular to a major axis of the sacrificial bars.

3. The method as recited in claim 1, wherein etching the exposed surfaces of the sacrificial islands comprises using an etchant including phosphoric acid.

4. The method as recited in claim 1, further comprising before etching the exposed surfaces of the sacrificial islands:
   etching the semiconductor substrate using the sacrificial islands and the mask patterns as etch masks to form trenches, the trenches defining active patterns.

5. The method as recited in claim 4, wherein forming the device isolation layer comprises:
   forming an insulation layer filling the trenches; and
   planarizing the insulation layer to form the device isolation layer, the device isolation layer exposing the top surfaces of the mask patterns and the sacrificial islands.

6. The method as recited in claim 4, further comprising, after forming the recessed channel region:
   etching the device isolation layer and the mask patterns to expose the top surface and upper sidewalls of the active patterns;
   forming a gate insulating layer to cover the exposed surfaces of the active patterns; and
   forming a gate electrode on the gate insulating layer filling the recessed channel region, the gate electrode crossing over the active patterns.

7. The method as recited in claim 1, wherein the sacrificial bars comprise silicon nitride or silicon oxynitride, and the mask layer and the device isolation layer comprise silicon oxide.

8. The method as recited in claim 7, wherein selectively removing the sacrificial islands comprises using an etchant including phosphoric acid.

9. A method of fabricating a semiconductor device, the method comprising:
   forming sacrificial bars on a semiconductor substrate;
   forming a mask layer to fill a space between the sacrificial bars;
   patterning the mask layer and the sacrificial bars in a direction substantially perpendicular to a major axis of the sacrificial bars to form mask patterns and sacrificial islands disposed therebetween;
   etching the semiconductor substrate using the mask patterns and the sacrificial islands as etch masks to form trenches, the trenches defining an active pattern;
   etching the sacrificial islands to partially expose a top surface of the active pattern between the mask patterns;
   forming a device isolation layer to fill the trenches and surround the mask patterns and the sacrificial islands;

selectively removing the sacrificial islands to expose the active pattern;

anisotropically etching the exposed active pattern using the device isolation layer and the mask patterns as etch masks to form a recessed channel region;

etching the device isolation layer to expose a top surface and an upper sidewall of the active pattern; and forming a gate electrode to fill the recessed channel region, the gate electrode crossing over the active pattern.

10. The method as recited in claim 9, wherein etching the sacrificial islands to partially expose the top surface of the active pattern between the mask patterns comprises:

isotropically etching the exposed surface of the sacrificial islands to a predetermined depth using a wet etch recipe having an etch selectivity with respect to the mask patterns and the semiconductor substrate.

11. The method as recited in claim 10, wherein, after etching the sacrificial islands, the sacrificial islands have a substantially rectangular solid shape.

12. The method as recited in claim 11, wherein, after etching the sacrificial islands, edges of the sacrificial islands exposed between the mask patterns have a curvature radius of less than one-fifth of a width of the mask patterns.

* * * * *